(12) United States Patent
Yamano

(10) Patent No.: US 6,291,879 B1
(45) Date of Patent: Sep. 18, 2001

(54) INTEGRATED CIRCUIT CHIP WITH IMPROVED LOCATIONS OF OVERVOLTAGE PROTECTION ELEMENTS

(75) Inventor: Seiya Yamano, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/289,640

(22) Filed: Apr. 12, 1999

(30) Foreign Application Priority Data

Apr. 15, 1998 (JP) .................................................. 10-104785

(51) Int. Cl.[7] ............................. H01L 27/04; H01L 23/40
(52) U.S. Cl. ......................... 257/691; 257/208; 257/207; 257/203; 257/367; 257/173; 257/174; 257/175; 257/355; 257/356; 257/357; 257/378; 257/773; 257/786
(58) Field of Search .......................... 257/773, 692–693, 257/775, 784, 786, 696, 218, 207, 203, 367, 379, 173, 174, 175, 355, 362, 341, 356, 357, 378

(56) References Cited

U.S. PATENT DOCUMENTS

| | | | | |
|---|---|---|---|---|
| 4,933,933 | * | 6/1990 | Dally et al. | 370/60 |
| 5,036,283 | * | 7/1991 | Trouiller et al. | 324/375 |
| 5,223,823 | * | 6/1993 | Pisanto et al. | 340/787 |
| 5,798,641 | * | 8/1998 | Spagna et al. | 324/228 |
| 5,835,458 | * | 11/1998 | Bischel et al. | 369/44.12 |
| 5,849,355 | * | 12/1998 | McHenry | 427/79 |
| 5,987,989 | * | 11/1999 | Yamamoto et al. | 73/514.24 |

FOREIGN PATENT DOCUMENTS

| | | |
|---|---|---|
| 60-10767 | 1/1985 | (JP) . |
| 2-165664 | 6/1990 | (JP) . |
| 3-27566 | 2/1991 | (JP) . |
| 3-147361 | 6/1991 | (JP) . |
| 5-206370 | 8/1993 | (JP) . |

OTHER PUBLICATIONS

Japanese Office Action dated Mar. 14, 2000 with partial translation.

* cited by examiner

Primary Examiner—Alexander O. Williams
(74) Attorney, Agent, or Firm—McGinn & Gibb, PLLC

(57) ABSTRACT

On a semiconductor integrated circuit chip, multiple equipotential power-line conductors are provided to supply power to circuit elements. First protecting elements are provided for interconnecting the power-line conductors for protecting the circuit elements. A number of input/output pads are also connected to the power-line conductors via second protecting elements. The arrangement is such that the contact positions of any of the first protecting elements and any of the second protecting elements on the power-line conductors are nearer to respective end portions of the conductors than the contact position of any of the circuit elements on the conductors. Each of the contact positions serves as a dividing point for dividing a high potential electrostatic charge into at least two low potential charges.

7 Claims, 6 Drawing Sheets

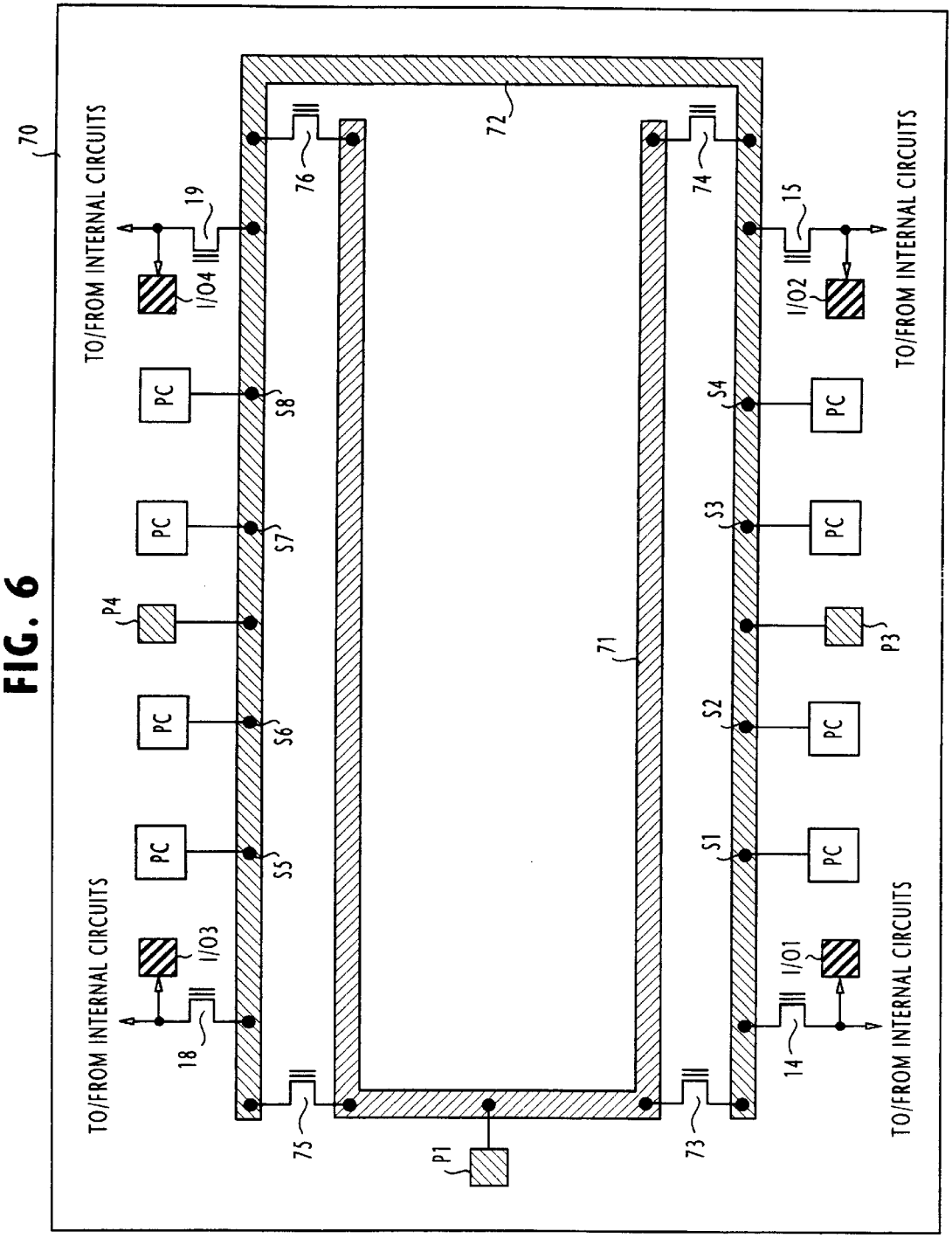

INTEGRATED CIRCUIT CHIP WITH IMPROVED LOCATIONS OF OVERVOLTAGE PROTECTION ELEMENTS

BACKGROUND OF THE INVENTION

1. Field of the Invention

The present invention relates generally to semiconductor integrid circuit chips, and more particularly to power supply arrangement for integrated circuit chips 2. Description of the Related Art Integrated-circuit technology currently uses multiple power and ground conductors for integrated circuits and various peripheral circuits in order to increase their operating performance and reliability. This arrangement requires that the layout plan must accommodate such conductors without increasing chip size. One solution is to provide a number of equipotential pads and provide as many power-line conductors within the interior of a chip as there are necessary for each of these pads.

Since there is a need for protecting sensitive circuit elements of an integrated circuit chip from electrostatic charges, protecting elements (or voltage sensitive devices) are located at strategic points of power-line conductors to allow "charge packets" to escape through discharge paths. However, overvoltage tests seem to indicate that part of integrated circuits still suffers from high potential charges.

SUMMARY OF THE INVENTION

The present invention is based on the discovery that current layout design for overvoltage protection is not adequate for protecting whole circuits from certain discharge patterns.

It is therefore an object of the present invention to provide a semiconductor integrated circuit chip that protects all circuit elements of the chip from all possible discharge patterns.

Another object of the present invention is to provide an integrated circuit chip in which the usually wasted corner areas of the chip are utilized.

According to one aspect of the present invention, there is provided a semiconductor integrated circuit chip comprising a plurality of equipotential power-line conductors to which circuit elements are connected, a plurality of pads connected to the power-line conductors, and a plurality of protecting elements for interconnecting the power-line conductors for protecting the circuit elements. The arrangement is such that the contact positions of the protecting elements on the conductors are nearer to respective end portions of the conductors than contact position of any of the circuit elements on the conductors. Each of the contact positions serves as a dividing point for dividing a high potential electrostatic charge into at least two low potential charges.

According to a second aspect, the present invention provides a semiconductor integrated circuit chip comprising a plurality of equipotential power-line conductors to which circuit elements are connected, a first plurality of protecting elements for interconnecting the power-line conductors for protecting the circuit elements, a plurality of input/output pads, and a second plurality of protecting elements for connecting the input/output pads to the power-line conductors. The arrangement is such that the contact positions of any of the first plurality of protecting elements and any of the second plurality of protecting elements on the conductors are nearer to respective end portions of the conductors than contact position of any of the circuit elements on the conductors. Each of the contact positions serves as a dividing point for dividing a high potential electrostatic charge into at least two low potential charges.

BRIEF DESCRIPTION OF THE DRAWINGS

The present invention will be described in further detail with reference to the accompanying drawings, in which:

FIG. 6 is a plan view of an integrated circuit chip according to a fourth modification of the present invention.

DETAILED DESCRIPTION

Figure 1:
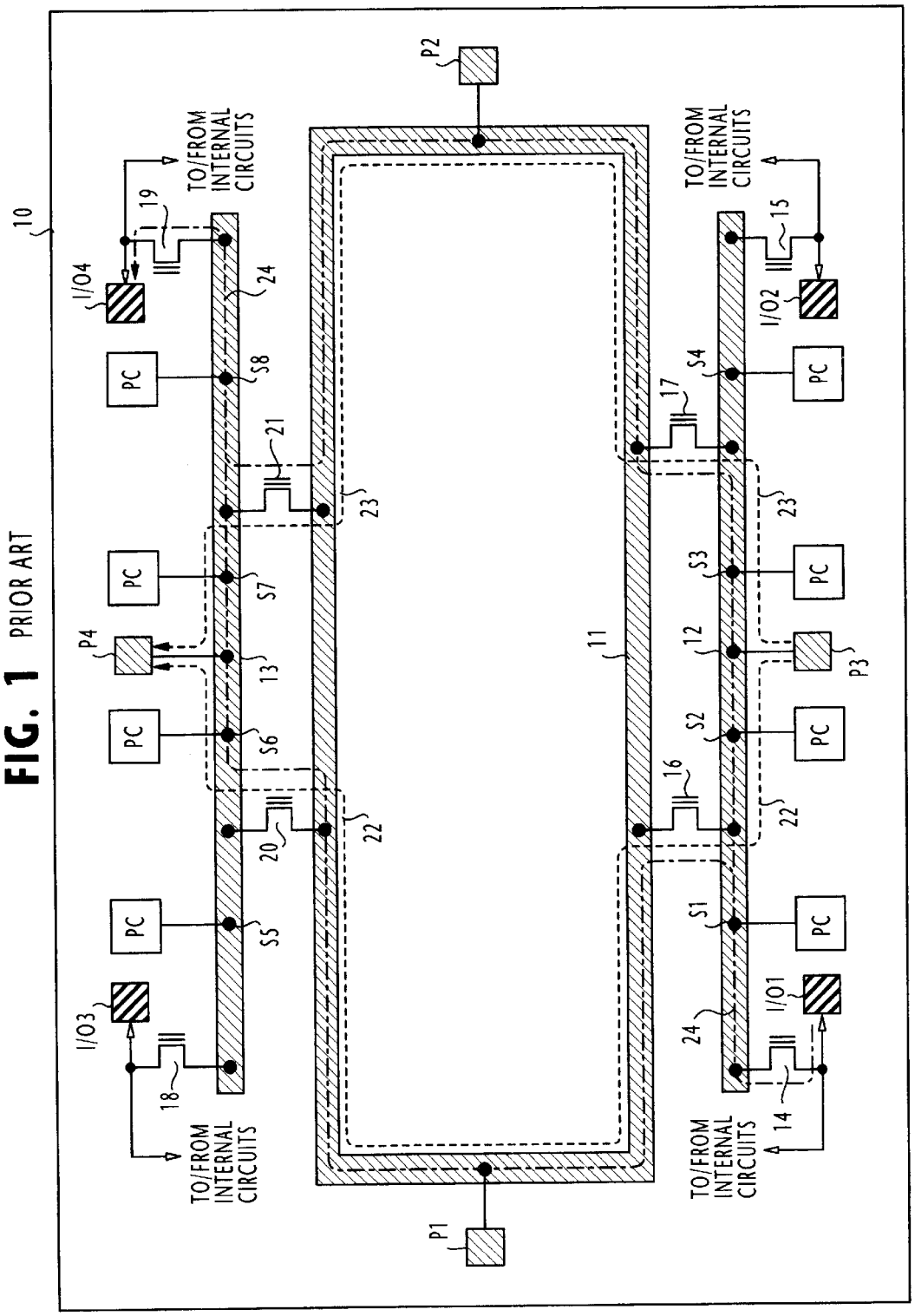
FIG. 1 is a plan view of a prior art integrated circuit chip.

Before proceeding with the detailed description of the present invention, it may be useful to provide an explanation of a prior art integrated-circuit chip in FIG. 1. An inner conductor 11 in the shape of a loop is provided within the interior of a semiconductor chip 10. Outer, elongate conductors 12 and 13 are provided, one on each horizontal side of the loop conductor 11. Equipotential pads P1 and P2 are connected to opposite points of the conductor 11. Within the inner conductor 11 are integrated circuits, not shown, which are connected to the conductor 11 to receive power from pads P1 and P2. Equipotential pads P3 and P4 are respectively connected to the outer conductors 12 and 13. Note that the levels of the potentials applied to conductors 11, 12 and 13 are of the same value.

Outer conductor 12 feeds power to peripheral circuits from contact points S1 and S2 located on one side of the contact point of pad P3 as well as from contact points S3 and S4 located on the other side of the contact point of pad P3. Similarly, the outer conductor 13 feeds power to peripheral circuits from contact points S5 and S6 located on one side of the contact point of pad P4 as well as from contact points S7 and S8 located on the other side of the contact point of pad P4. Input/output signal pads I/O1 to I/O4 are provided, one at each end of the outer conductors, to receive input signals from associated external input/output devices for coupling to associated internal circuits of the chip 10 or supply output signals from the internal circuits to the external input/output devices.

Protecting elements, such as floating-gate field effect transistors 14 to 21, are provided to create discharge paths within the chip 10 when an overvoltage develops across a pair of pads due to electrostatic charges. Protecting elements 14 and 15 serve as discharge paths between the pads I/O1, I/O2 and the outer conductor 12, and the protecting elements 18 and 19 serve as discharge paths between the pads I/O3, I/O4 and the outer conductor 13. Discharge paths between conductors 11 and 12 are created by the protecting elements 16 and 17 and those between conductors 11 and 13 are provided by the protecting elements 20 and 21. On the conductor 12, the protecting element 16 is located between the connecting points S1 and S2 of peripheral circuits, and the protecting element 17 is located between the connecting points S3 and S4 of peripheral circuits.

If a high voltage charge develops at pad P3, it causes charge packets to flow in opposite directions along conductor 12. These charge packets find their ways through protecting elements 16 and 17 to the conductor 11 and pass through protecting elements 20 and 21 to the outer conductor 13, where they are discharged through pad P4, as indicated by broken lines 22 and 23. Since the high voltage charge is divided between protecting elements 16 and 17, the integrated circuits connected to the points S2 and S3 are protected from possible damage.

If a high voltage charge develops at input/output pad I/O1, it discharges onto the outer conductor 12 via protecting element 14, where it divides into charges respectively passing through protecting elements 16 and 17 to conductor 11. These charges pass through protecting elements 20 and 21 to conductor 13. If they find low impedance paths to pad I/O4, they will be discharged through the protecting element 19, as indicated by chain-dot lines 24. Since the point S1 is connected to the section of the conductor 12 where the charge of highest potential propagates, the integrated circuit receiving power from the point S1 is exposed to a voltage of harmful level.

Additionally, since the high potential charge flows through a section of the conductor 12 that extends from the contact point of protecting element 14 to that of protecting element 16 before its energy is split into two, that section of conductor 12 offers high resistance to the flow of charge packets, causing them to discharge at low speed to produce a deleterious effect on the protecting element 14 and the associated integrated circuit.

It is therefore seen that overvoltage protection of the prior art layout is not adequate for some of the peripheral circuits as well as for protecting elements 14, 15, 18, 19 due to improper locations of protecting elements 16, 17, 20, 21.

Figure 2:
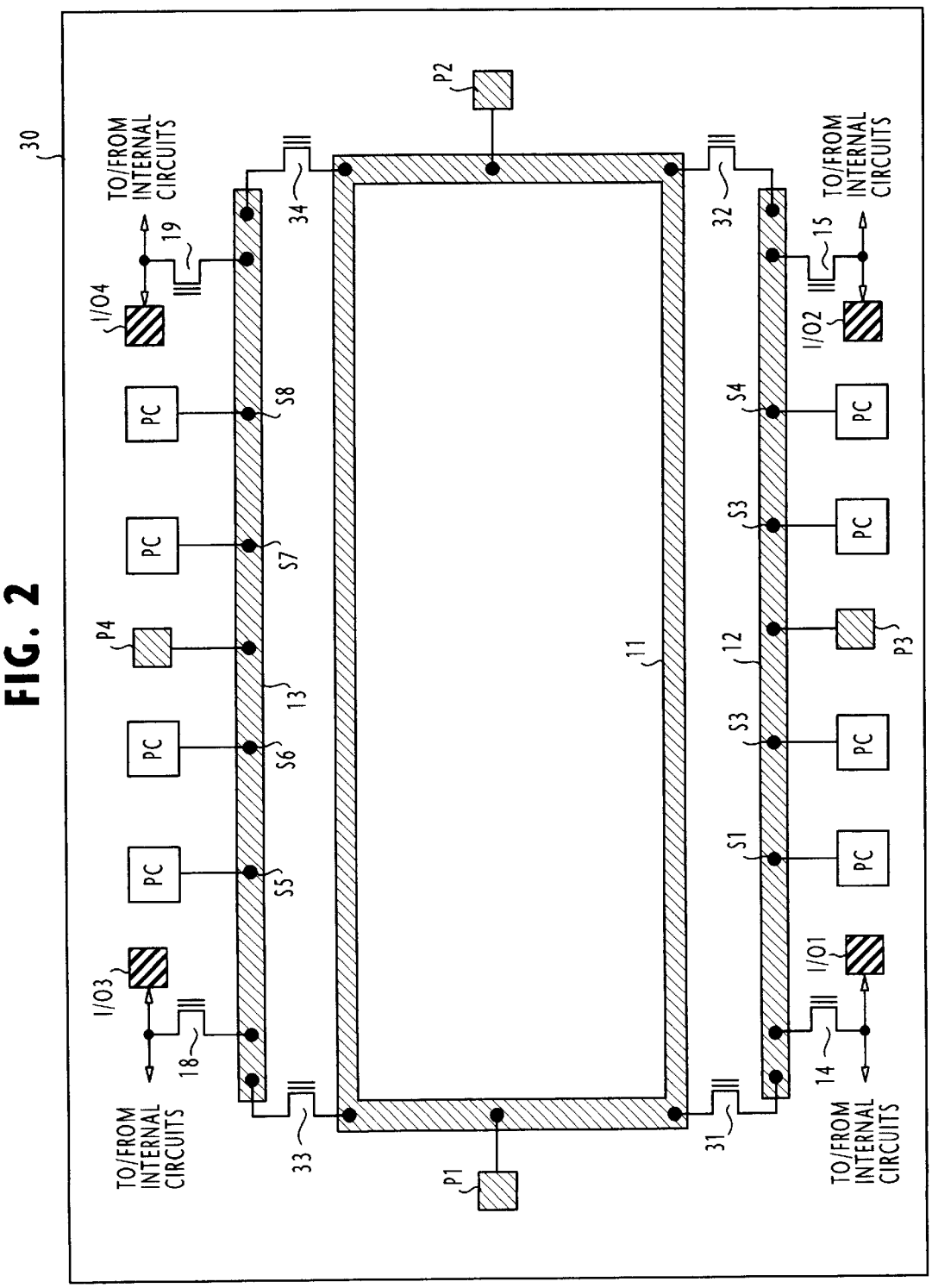
FIG. 2 is a plan view of an integrated circuit chip according to one embodiment of the present invention.

In FIG. 2, an integrated circuit chip according to a first embodiment of the present invention is illustrated, wherein parts corresponding in significance to those in FIG. 1 are marked with the same numerals as those in FIG. 1. Instead of the protecting elements 16 to 20 of FIG. 1, the integrated circuit chip 30 of this invention is provided with protecting elements 31 to 34. Each of the protecting elements 31 and 32 is connected between an end of elongate conductor 12 and a corresponding corner of the loop conductor 11 so that its position is nearer to that end than the position of each of the contacts S1 to S4. In a similar manner, each of the protecting elements 33 and 34 is connected between an end of elongate conductor 13 and a corresponding corner of the loop conductor 11 so that its position is nearer to that end than the position of each of the contacts S5 to S8.

The contact point of each of the protecting elements 31, 32, 33 and 34 serves as a dividing point of a high potential electrostatic charge where it divides into low potential charge packets. If a high voltage charge develops at the inputloutput pad I/O1, it discharges onto the leftmost end of the outer conductor 12 via protecting element 14, where the discharging path divides into two, one via protecting element 31 to the lower left corner of the loop conductor 11 and the other to the rightmost end of conductor 12 where the protecting element 32 connects to the lower right corner of the loop conductor 11. Charge packets discharged onto the loop conductor 11 propagate via two paths to the conductor 13, one via the protecting element 33 and the other via the protecting element 34. If the paths to the pad I/O4 are lower in impedance than those to the pad I/O3, the charge packets will find their final paths through protecting element 19.

Since the potential of the energy discharged to the conductor 12 reduces to about one half of the original level at the point where the discharging path divides, the peripheral circuits connected to points S1 to S4 are not exposed to harmful potentials. In addition, since the conductor 12 has no section on its length where high potential charge packets propagate, there is no high resistance path for the discharging energy. No harmful voltage offset thus occurs at the protecting element 14. The same applies to protecting elements 15, 18 and 19 when their corresponding input/output pads build up high potential electrostatic charges.

Note that the protecting elements 31, 32, 33 and 34 are respectively located in the corner areas of the chip 30 which are usually left unused by sensitive circuit elements because of possible physical deformation due to external force exerted on the chip. Since these protecting elements are not sensitive devices and since the power-line conductors 11, 12 and 13 are at equal potential levels, the protecting elements 31, 32, 33 and 34 do not serve as leakage paths even if the conductors 11, 12 and 13 are physically brought into contact with each other if the chip structure is deformed under excessive external force. Thus, the provision of protecting elements 31, 32, 33 and 34 at the corner areas of chip 30, instead of protecting elements 16, 17, 20, 21 of FIG. 1, adds an extra space useful for internal circuitry.

Figure 3:
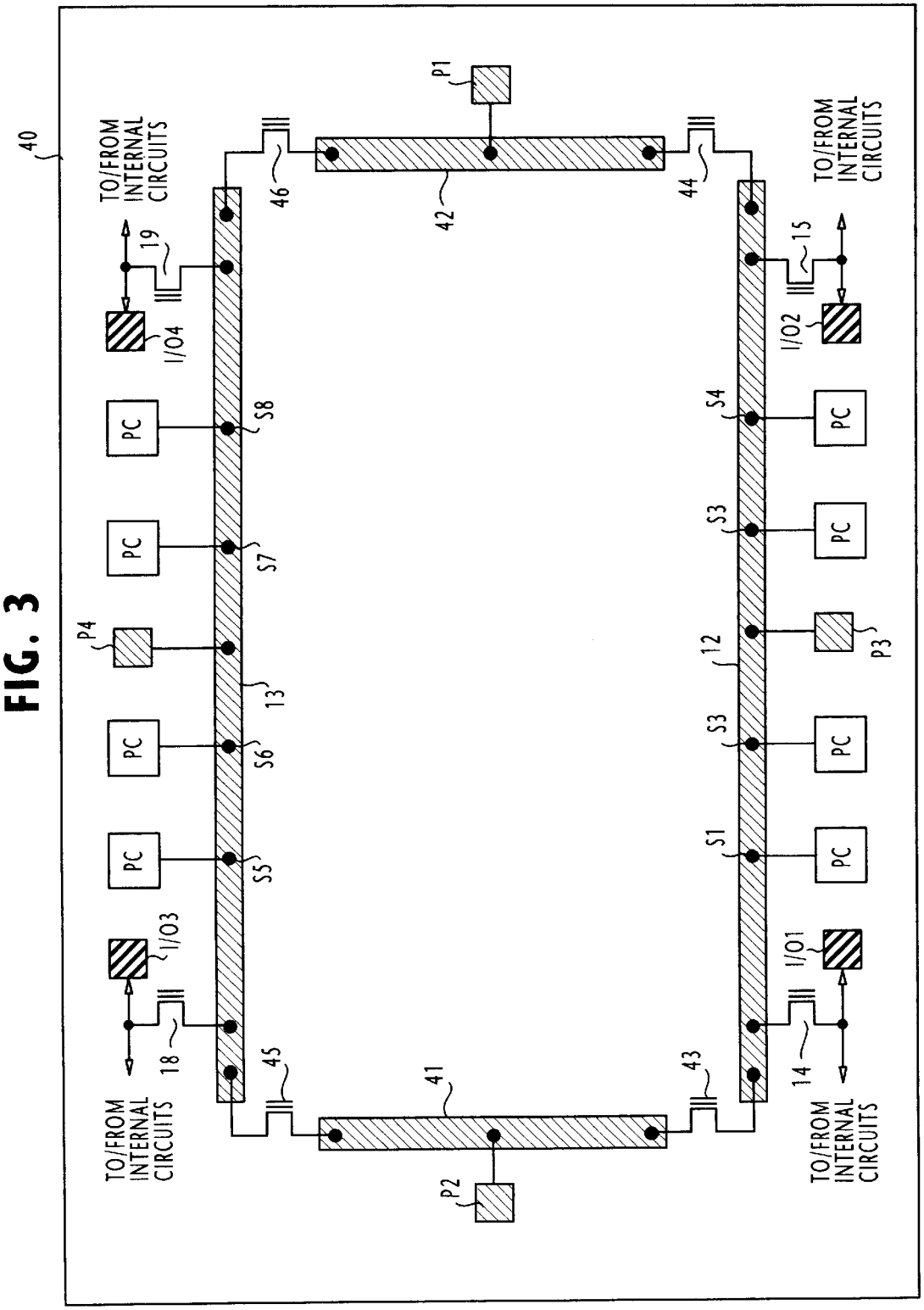
FIG. 3 is a plan view of an integrated circuit chip according to a first modification of the present invention.

The present invention can be modified as follows:

A first modification of the present invention is shown in FIG. 3, in which vertical conductors 41 and 42 are provided on opposite sides of a chip 40, instead of the inner loop conductor 11 of the previous embodiment, and the pads P1 and P2 are respectively connected to the conductors 41 and 42. Vertical conductor 41 is connected between the rightmost ends of horizontal conductors 12 and 13 by protecting elements 43, 45, and vertical conductor 42 is connected between the leftmost ends of these horizontal conductors by protecting elements 44, 46. Integrated circuits of the chip 40 are enclosed by power-line conductors 12, 13, 41 and 42, with the protecting elements 43 to 46 being located at the respective corner areas of the chip 40.

Figure 4:
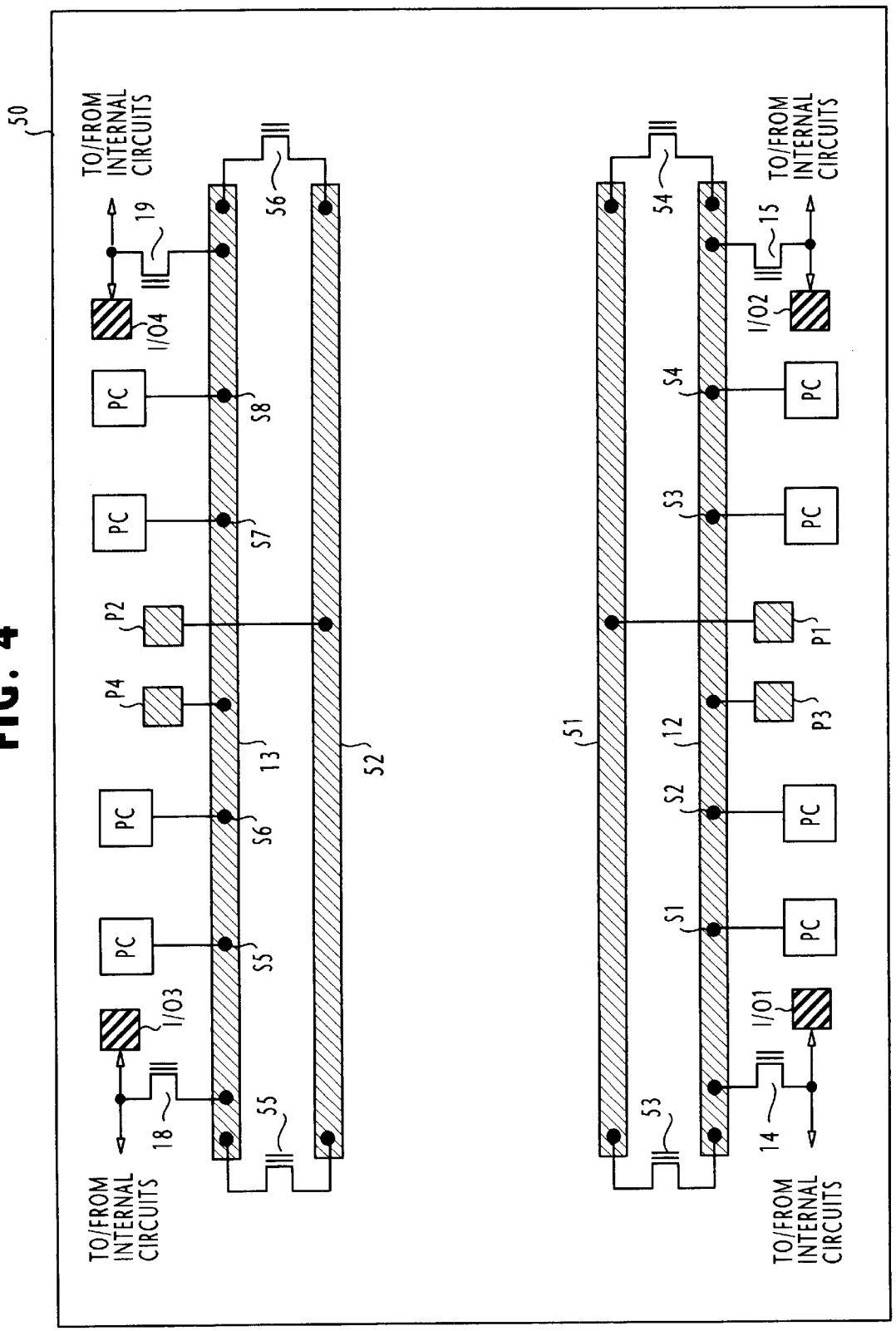
FIG. 4 is a plan view of an integrated circuit chip according to a second modification of the present invention.

A second modification of the present invention is shown in FIG. 4, in which horizontal conductors 51 and 52 are provided on opposite sides of a chip 50, instead of the inner loop conductor 11 of the first embodiment, and the pads P1 and P2 are respectively connected to the conductors 51 and 52. Horizontal conductor 51 is connected between the opposite ends of horizontal conductor 12 by protecting elements 53, 54, and horizontal conductor 52 is connected between the opposite ends of the horizontal conductor 13 by protecting elements 56, 56. Integrated circuits of the chip 50 are provided between power-line conductors 51 and 52, with the protecting elements 53 to 56 being located at the respective corner areas of the chip 50.

Figure 5:
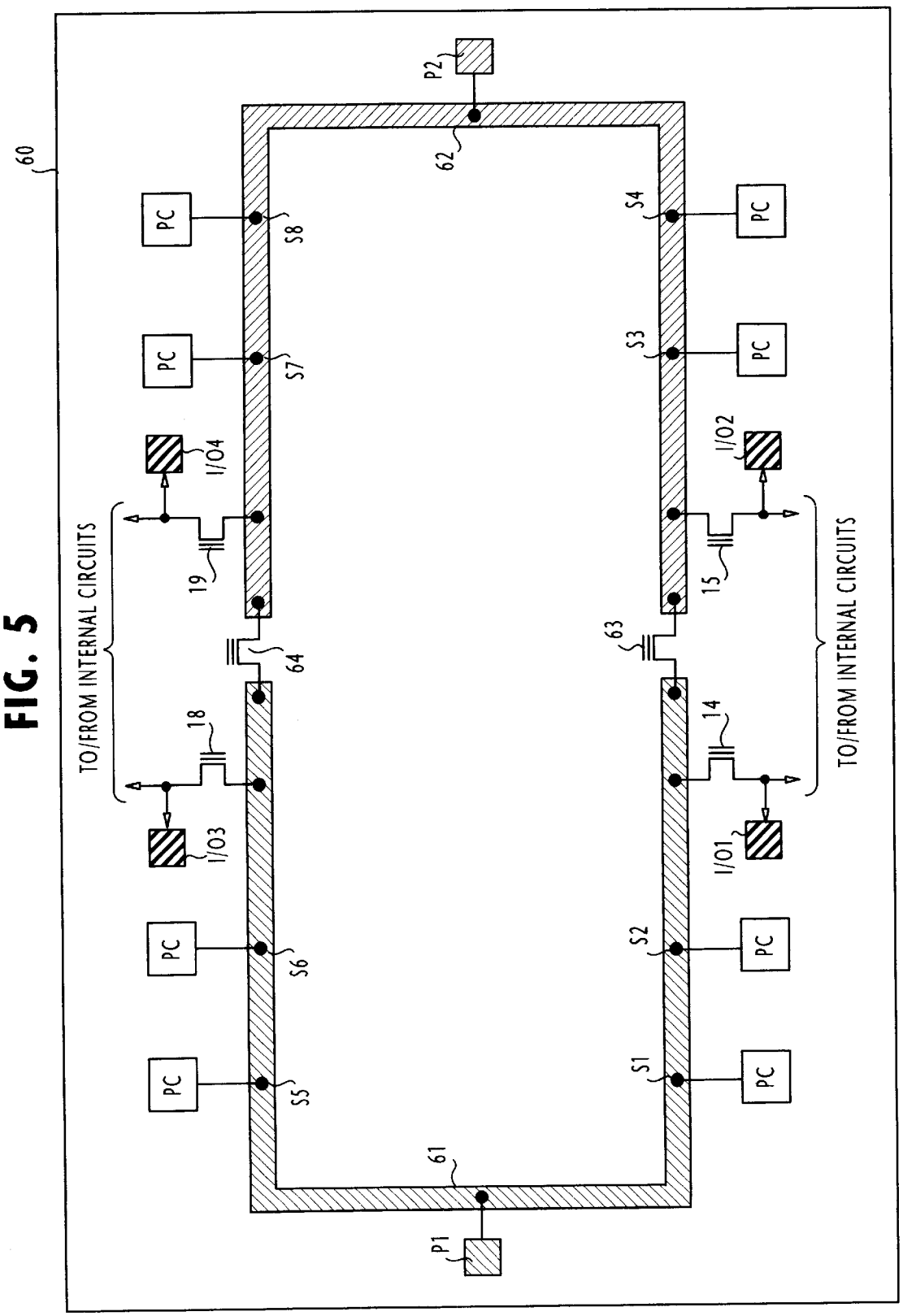
FIG. 5 is a plan view of an integrated circuit chip according to a third modification of the present invention.

A third modification of the present invention is shown in FIG. 5. In this modification, a generally C-shaped conductor 61 and a generally inverted C-shaped conductor 62 are provided on a chip 60, instead of the inner loop conductor 11 and horizontal conductors 12 and 13 of the first embodiment, and the pads P1 and P2 are respectively connected to the vertical segment of the conductors 61 and 62. The opposite ends of the conductor 61 are connected to the ends of conductor 62 by protecting elements 63 and 64, enclosing integrated circuits of the chip 60.

Note that the I/O signal pads I/O1 and I/O2 are respectively connected to lower end portions of the conductors 61 and 62 via protecting elements 14, 15, with the contact points of protecting elements 14, 15 on the conductors 61 and 62 being nearer to the lower ends of these conductors than any of the contact points S1 to S4 so that peripheral circuits connected to points S1, S2, S3 and S4 are not exposed to harmful voltage of discharged energy. Likewise, the I/O signal pads I/O3 and I/O4 are connected respectively to upper end portions of the conductors 61 and 62 by protecting elements 18, 19, the contact points of protecting elements 18, 19 on the conductors 61 and 62 being nearer to the upper ends of these conductors than any of the contact points S5 to S8 so that peripheral circuits connected to points S5 to S8 are not exposed to harmful voltage of discharged energy.

A fourth modification of the present invention is shown in FIG. 6, which differs from the embodiment of FIG. 2 in that a generally C-shaped conductor 71 is formed on a chip 70 by removing a right-side vertical segment of the loop conductor 11 of FIG. 2 and a generally inverted C-shaped conductor 72 is formed by connecting the horizontal outer conductors 12 and 13 of FIG. 2 with a vertical segment. The leftmost end of the lower horizontal segment of conductor 72 is connected to the lower-left corner of conductor 71 by a protecting element 73 and the rightmost end of the lower horizontal segment of conductor 71 is connected to the lower-right corner of conductor 71 via a protecting element 74. Likewise, the leftmost end of the upper horizontal segment of conductor 72 is connected to the upper-left corner of conductor 71 via a protecting element 75 and the rightmost end of the upper horizontal segment of conductor 71 is connected to the upper-right corner of conductor 71 via a protecting element 76.

What is claimed is:

1. A semiconductor integrated circuit chip comprising:
   a plurality of equipotential power-line conductors to which circuit elements are connected;
   a first plurality of protecting elements interconnecting said power-line conductors;
   a plurality of input/output signal pads; and
   a second plurality of protecting elements connecting said input/output signal pads to said power-line conductors,
   contact positions of any of said first plurality of protecting elements and any of said second plurality of protecting elements on said power-line conductors being nearer to respective end portions of said conductors than contact position of any of said circuit elements on said conductors, each of said contact positions serving as a dividing point for dividing a high potential electrostatic charge into at least two lower potential charges.

2. The semiconductor integrated circuit chip of claim 1, wherein said first plurality of protecting elements are formed in respective corner areas of said integrated circuit chip.

3. The semiconductor integrated circuit chip of claim 1, wherein said power-line conductors comprise an inner, loop conductor and a pair of outer conductors arranged one on each side of said loop conductor.

4. The semiconductor integrated circuit chip of claim 1, wherein said power-line conductors comprise elongate conductors arranged on respective sides of said integrated circuit chip.

5. The semiconductor integrated circuit chip of claim 1, wherein said power-line conductors comprise a first pair of parallel elongate conductors arranged on one side of said integrated circuit chip and a second pair of parallel elongate conductors arranged on an opposite side of said integrated circuit chip.

6. The semiconductor integrated circuit chip of claim 1, wherein said power-line conductors comprise a generally C-shaped conductor arranged on one side of said integrated circuit chip and a generally inverted C-shaped conductor arranged on an opposite side of said integrated circuit chip, end portions of the generally C-shaped conductor being connected to end portions of the generally inverted C-shaped conductor by said first plurality of protecting elements.

7. The semiconductor integrated circuit chip of claim 1, wherein said power-line conductors comprise a generally C-shaped conductor and a generally inverted C-shaped conductor, horizontal segments of the generally C-shaped conductor being arranged parallel with horizontal segments of the generally inverted C-shaped conductor, end portions of the generally C-shaped conductor being connected to corner portions of the generally inverted C-shaped conductor by said first plurality of protecting elements, and end portions of the generally inverted C-shaped conductor being connected to corner portions of the generally C-shaped conductor by said first plurality of protecting elements.

* * * * *